United States Patent [19]

Nagami

[11] Patent Number: 4,899,316
[45] Date of Patent: Feb. 6, 1990

[54] SEMICONDUCTOR MEMORY DEVICE HAVING SERIAL WRITING SCHEME

[75] Inventor: Akira Nagami, Tokyo, Japan

[73] Assignee: NEC Corporation, Tokyo, Japan

[21] Appl. No.: 947,451

[22] Filed: Dec. 29, 1986

[30] Foreign Application Priority Data

Dec. 26, 1985 [JP]  Japan .................................. 60-294147

[51] Int. Cl.⁴ ............................................. G11C 7/00
[52] U.S. Cl. ................................ 365/189.01; 365/221
[58] Field of Search ............... 365/189, 221, 230, 233, 365/239, 240, 219

[56] References Cited

U.S. PATENT DOCUMENTS 4,633,441 12/1986 Ishimoto ............................. 365/189
4,688,197 8/1987 Novak et al. ....................... 365/230

Primary Examiner—Joseph A. Popek
Attorney, Agent, or Firm—Sughrue, Mion, Zinn, Macpeak, and Seas

[57] ABSTRACT

An improved semiconductor memory which can achieve high-speed data processing is disclosed. The memory comprises a memory array, a random access port for accessing a desired one of memory cell in accordance with row and column addresses, a serial read circuit for consecutively reading data from the selected row one by one and a serial write circuit for consecutively writing data to the selected row one by one without specific column address information.

8 Claims, 5 Drawing Sheets

SEMICONDUCTOR MEMORY DEVICE HAVING SERIAL WRITING SCHEME

BACKGROUND OF THE INVENTION

The present invention relates to a semiconductor memory device, and more particularly to that suitable for application to video field.

Semiconductor memories have been utilized for storing display information for such as information processing system and TV system. Representative semiconductor memories are structured in such that a plurality of memory cells are arranged in a matrix form of rows and columns and one memory cell is selected for read or write for each access cycle. Therefore, an operation speed of such memories and amount of information to be accessed for unit of time have been limited. In order to implement a large amount of data accessing, an interleave technique in which a plurality of memories are alternately accessed and a parallel-serial conversion technique in which a plurality bits of data applied from the outside in series are once held by a register in parallel and data held by the register are stored in a plurality of memories in parallel. According to these technique, effective amount of data accessed for each cycle time is increased remarkably and high speed operation is resultantly achieved.

However, the above two techniques require complicated peripheral control circuits for controlling the respective memories. Therefore, the above two memories systems according to the above two techniques have been fabricated by a large amount of elements, and it has been difficult to fabricate such improved memory system on a semiconductor chip.

SUMMARY OF THE INVENTION

It is an object of the present invention to provide a semiconductor memory device operable at a high speed.

It is another object of the present invention to provide a semiconductor memory device having high speed serial read/write function.

The memory semiconductor memory according to the present invention is of the type having a memory array of a plurality of memory cells arranged in rows and columns, a row selection circuit for selecting one of the rows and a random access (RAM) port for selecting a part of the columns for reading and writing data from or to in accordance with column address information, and is featured in that a serial read port for sequentially selecting the columns one by one for reading therefrom and a serial write port for sequentially selecting the columns for writing thereto one by one.

According to the present invention, the above three ports, i.e., the RAM port, the serial read port and the serial write port operate in parallel and therefore high speed writing operations through the serial write port and high speed reading operations through the serial read port are simultaneously achieved. Thus, high speed data processing can be achieved without any special peripheral circuit.

The memory device according to the present invention is utilized as a video memory for storing video image information.

DETAILED DESCRIPTION OF THE INVENTION

Figure 1:
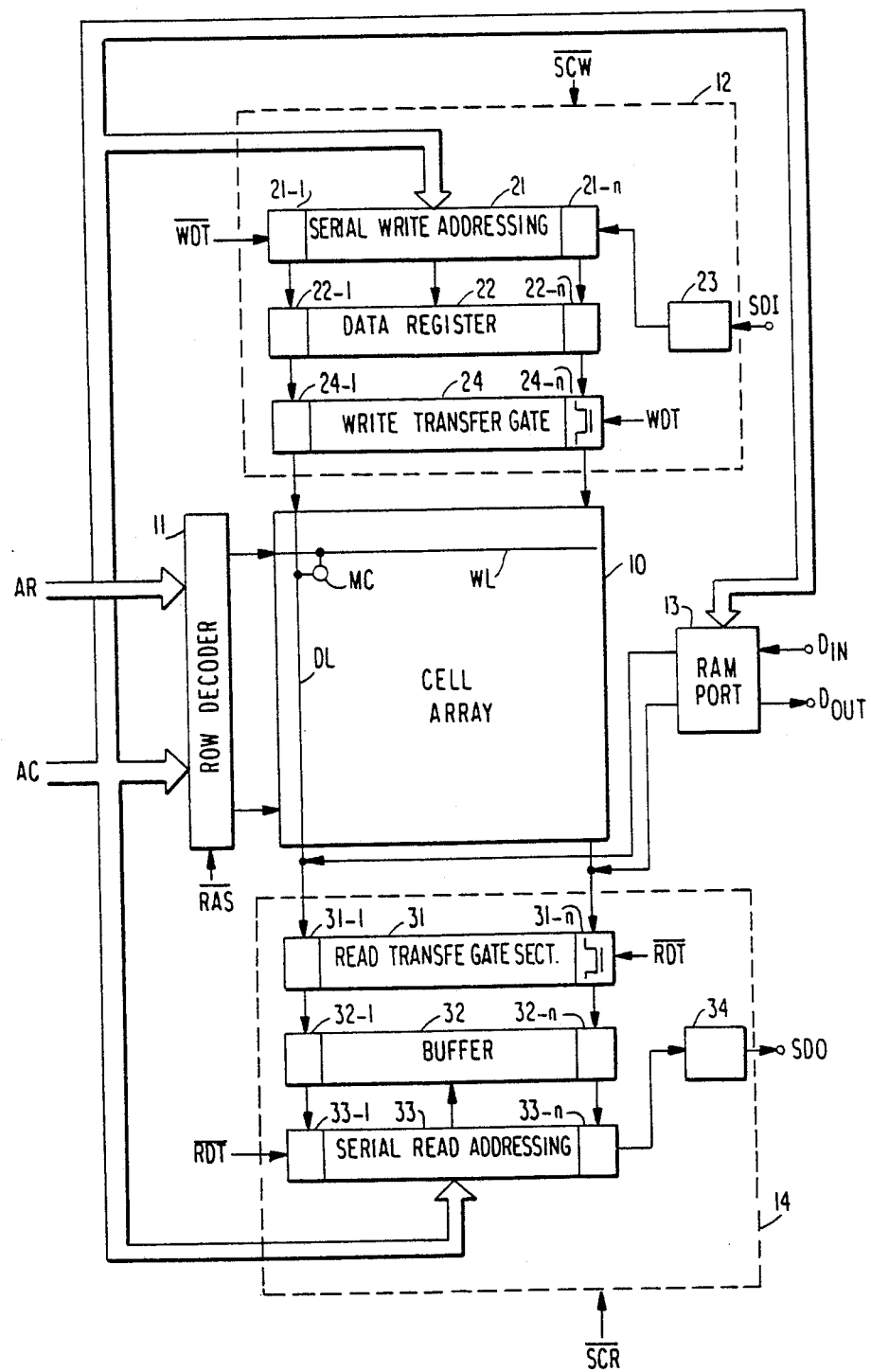
FIG. 1 is a schematic block diagram showing a memory according to one embodiment of the present invention.

FIG. 1 shows a schematic block diagram of a memory device according to the present invention.

A memory array includes a plurality of memory cells MC each coupled to a word line WL and a digit line DL. A row decoder 11 operatively selects one of word lines WL in accordance with row address information AR when a row address strobe $\overline{RAS}$ is low in level. A random access (RAM) port 13 has interface with the respective digit lines and a data input terminal $D_{IN}$ and a data output terminal $D_{OUT}$. The RAM port 13 operatively outputs data on a selected one of the digit lines to $D_{OUT}$ in a read mode and applies data at $D_{IN}$ to a selected digit line in accordance with column address information AC when a column address strobe $\overline{CAS}$ is at low. The function of the RAM port 13 is the same as that of a conventional random access memory. A serial read port 14 has a read line buffer section 32 having n-bits of storage units 32-1 to 32-n, a read data transfer gate section 31 having n-bits of data transfer gates 31-1 to 31-n, and a serial read addressing section 33 having n-bits of selecting units 33-1 to 33-n, and an output circuit 34. The transfer gate section 31 transfers data on the respective digit lines to the buffer section 32 in parallel when a read data transfer signal $\overline{RDT}$ is at low. The addressing section 33 is made of a shift register or a counter in a known way. The addressing section 33 takes in column address information AC during a read data transfer period and determines which column location, i.e., bit line is selected at the beginning of a serial read cycle and in the serial read cycle the addressing section 33 selects sequentially the column locations one by one from the initial column location in response to a read control signal $\overline{SCR}$. The selected output of the addressing section enables one of the storage units 32-1 to 32-n and data stored in the enabled storage unit is applied to the output circuit 34 and to the serial output terminal $S_{DO}$.

A serial write port 12 includes a data register section 22 having n-bits of register units 22-1 to 22-n, a write transfer gate section 24 composed of n-bits of write transfer gates 22-1 to 22-n for operatively transferring data on the respective units 22-1 to 22-n to the respective digit lines, a serial write addressing circuit 21 having n-bits of selecting units 21-1 to 21-n for sequentially selecting the storage units to be accessed, and an input data buffer 23.

The serial write addressing circuit 21 which may be composed of a shift register or counter, takes in column address information during a write data transfer period and determines an initial column location of storage unit to be accessed first in a serial write cycle and sequentially selects the storage units one by one in response to a write control signal $\overline{SCW}$.

Figure 2:
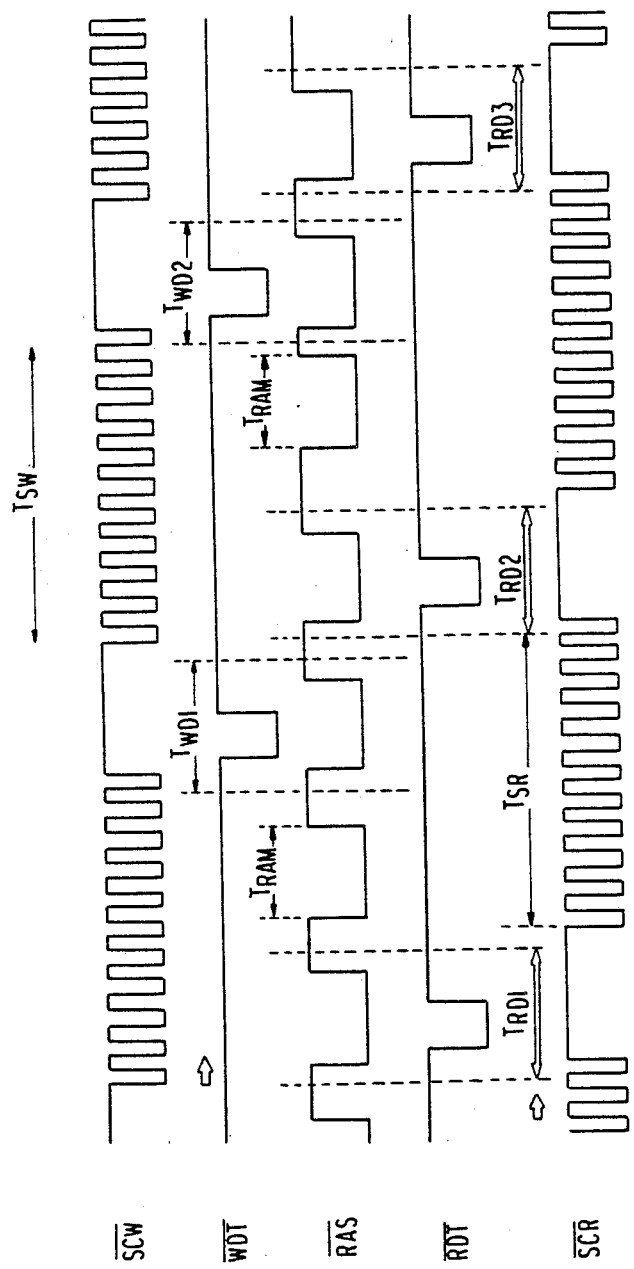
FIG. 2 is a timing waveform showing operations of the memory of FIG. 1.

Referring to FIG. 2, representative operations of the memory of FIG. 1 is explained.

Since three ports 12, 13 and 14 operate asynchronously from each other, these three ports operate independently.

First, serial write operation is explained.

During a write data transfer period $T_{W1}$, $\overline{RAS}$ and $\overline{WDT}$ are changed to low. In response to a low level of $\overline{WDT}$, all the transfer gates of the transfer gate section 24 are enabled, and data stored in the register section 22 which have been written into the register section during the previous serial write cycle are written into the respective digit lines and finally to memory cells coupled to the selected word line in parallel. In this instance, $\overline{RDT}$ is kept high and the read transfer gate section 31 is diesnabled to isolate the read register section 32 from the memory array 10 and therefore contents of the register section 31 are not affected by the new data held by the write register section 22.

Also in this write data transfer period $T_{WD1}$, the new column address information AC is introduced into the write addressing circuit 21 for determining an initial column location to be accessed first in the subsequent serial write cycle.

After the write data transfer cycle $T_{WD1}$, a serial write cycle $T_{SW}$ is introduced and write data is first written via SDI and the circuit 23 to the selected register unit 22-i ($1 \leq i \leq n$) and thereafter in response to each low level of $\overline{SCW}$ the register units 22-i+1, 22-i+1, 22-i+2 . . . are sequentially selected by the addressing circuit 21 and write data are written thereto from the circuit 23, one by one. The data written into the register section 22 through this serial write cycle $T_{SW}$ are written into the respective digit lines of the memory array 10 at the subsequent write data transfer period $T_{WD2}$ in response to a low level of $\overline{WDT}$.

Read operation is then explained.

During a read data transfer period $TRD_1$, and $\overline{RAS}$ and $\overline{RDT}$ are changed low in level so that all the transfer gates in the transfer gate section 31 are enabled and data on the respective digit lines are written into the line buffer section 32 in parallel. While also during this period $T_{RD1}$, column address information AC is applied to the addressing circuit 33 for determining the initial column address to be accessed first in the subsequent serial read cycle $T_{SR}$. In the serial read cycle $T_{SR}$, data stored in the storage unit 32-i corresponding to the above initial column location is first selected by the addressing circuit 33 and outputted to $S_{DO}$ via the output circuit 34 and thereafter data stored by the storage units 32-i+1, 32-i+2, . . . are sequentially selected by the addressing circuit 33 in synchronism with the respective changes of $\overline{SCR}$ to a low level and outputted to $S_{DO}$.

In order to avoid interference between read data and write data, the read data transfer period $T_{RD}$ and the write data transfer period $T_{WD}$ are introduced different timings from each other, as illustrated.

A random access cycle $T_{RAM}$ in which data of a selected by row address information AR and column address information AC is accessed by the RAM port 13 is introduced at a desired period other than the read data transfer period $T_{RD}$ and the write data transfer period $T_{WD}$ because the memory array 10 is isolated from the serial read port 14 and the serial write port 12 during the above desired period and hence the RAM port 13 can access the memory array without limitation.

Figure 3:
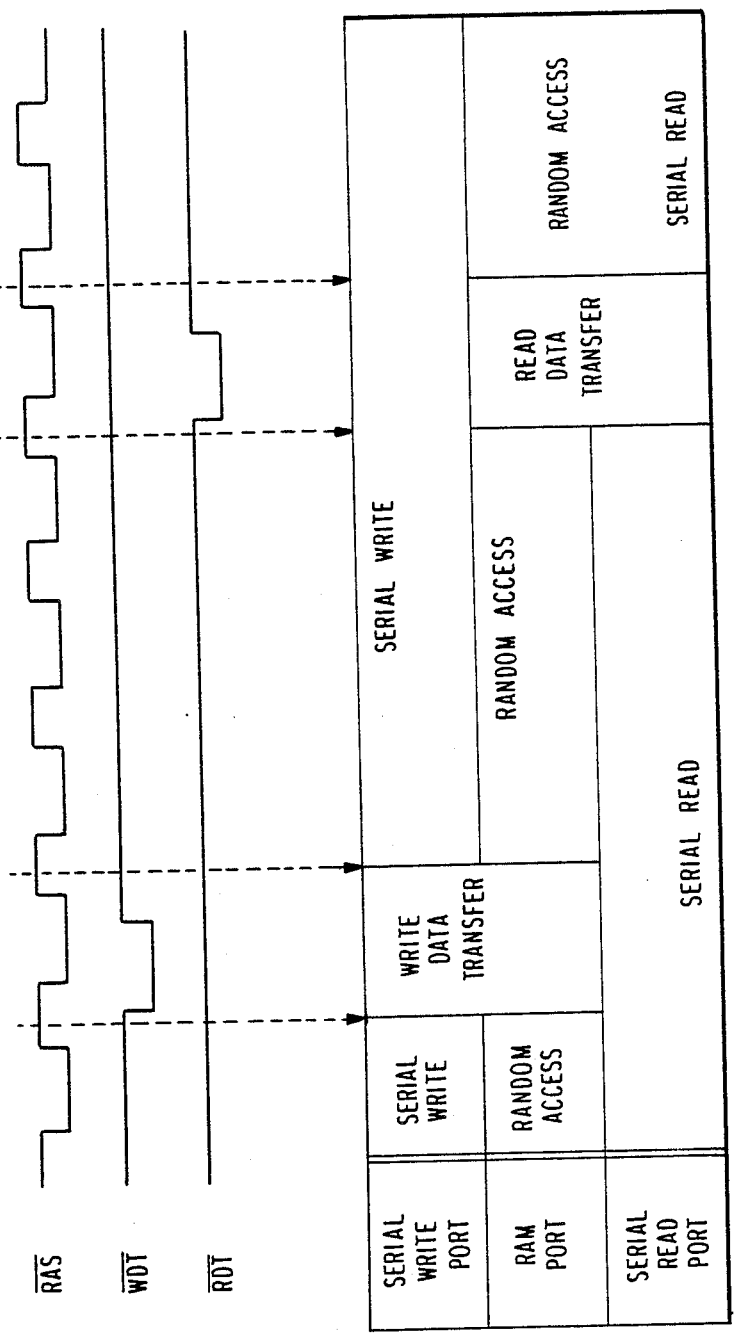
FIG. 3 is a diagram showing a serial write operation, a serial read operation and an random access operation in the memory of FIG. 1.

Thus, a serial read operation, a serial write operation and a random access operation can be performed in parallel, as explained in FIG. 3, according to the present invention.

Figure 4:
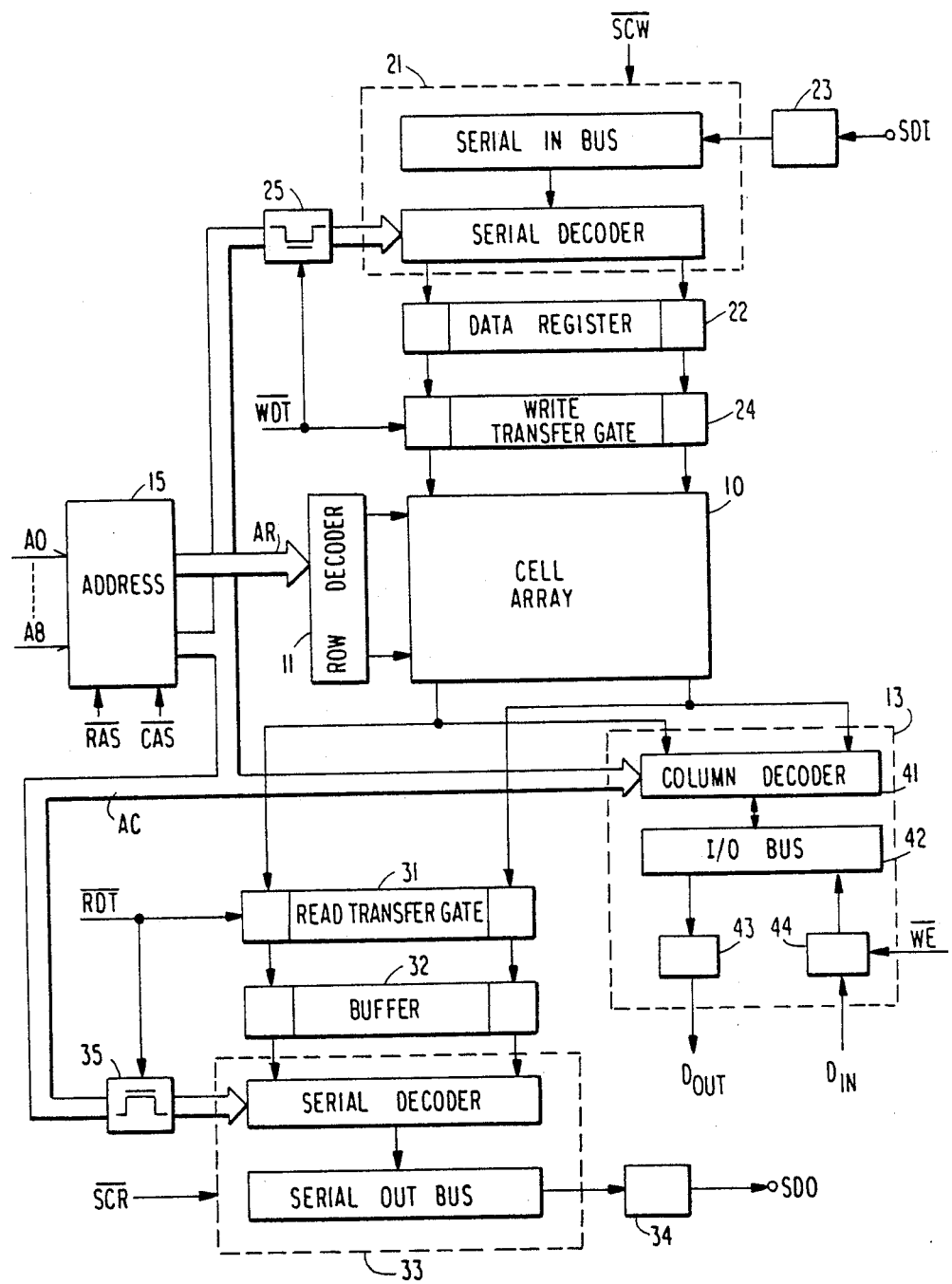
FIG. 4 is a schematic block diagram showing a memory device according to another embodiment of the invention.

FIG. 4 shows a more detailed example of the embodiment shown in FIG. 1.

An address buffer 15 receives address signals from address terminals A0 to A8, $\overline{RAS}$ and a column address strobe $\overline{CAS}$. The address buffer 15 samples A0 to A8 as column address information AC at that time when $\overline{CAS}$ changes high to low in level and holds it thereafter and samples A0 to A8 as row address information AR at the time when $\overline{RAS}$ changes from high to low in level and holds it thereafter.

A gate circuit 25 is provided to apply the column address information AC to the serial addressing circuit 21 composed of a serial input bus and a serial decoder when $\overline{WDT}$ is at low in level. A gate circuit 35 is provided to apply the column address information to the serial addressing circuit 33 including a serial output bus and a serial decoder. The RAM port 13 includes a column decoder 41 which selectively connects one of the digit lines to a data-in circuit 44 and a data-out circuit 43 in accordance with the column address information AC. The data-in circuit 44 is controlled by a write signal $\overline{WE}$.

Figure 5:
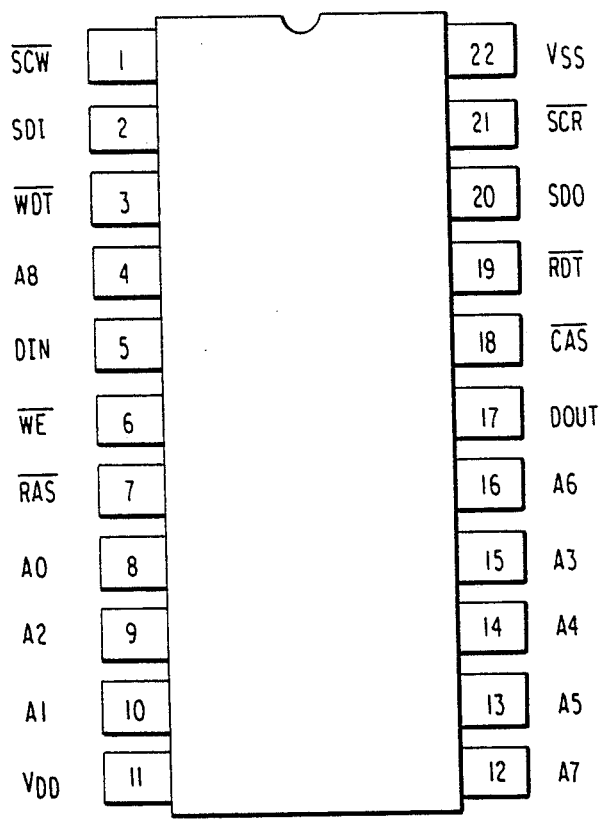
FIG. 5 is a diagram showing one example of layout of external leads of the memory of FIG. 4.

FIG. 5 shows one example of layout of external leads of the memory of FIG. 4.

I claim:

1. A semiconductor memory device comprising; a memory array of a plurality of memory cells arranged in rows and columns, means for selecting one of said rows thereby to enable the memory cells of the selected row for writing data thereto or reading data therefrom through said columns, a random access circuit coupled to said columns of said memory array for performing a random selection of said column for reading data therefrom or writing data thereto in response to column address information, a first terminal, a serial read circuit coupled to said first terminal and said columns for sequentially k outputting at said first terminal data from said columns one by one, a second terminal to which write data are sequentially applied one by one, a serial write circuit couple to said second terminal and to said columns for operatively writing write data sequentially applied to said second terminal to said columns simultaneously, first control means for enabling said serial read circuit, and second control means for enabling said serial write circuit independently of said serial read circuit.

2. The memory device according to claim 1 in which said serial read circuit includes a data register section having a plurality of register units, a read transfer gate section having a plurality of transfer gates each coupled between each one of columns and each one of said register units, an output circuit coupled to said first terminal and a serial read selection circuit for serially selecting said transfer gates one by one thereby to transfer data held by said register units to said output circuit in synchronism with a first control signal.

3. The memory device according to claim 1, in which said serial write circuit includes a data storage section having a plurality of storage units, a write transfer gate section having a plurality of transfer gates each coupled between each one of said storage units and each one of said columns, a data input circuit coupled to said second terminal for receiving write data, and a serial write selection circuit for selecting said transfer gates of said write transfer gate section thereby to apply write data to said storage units one by one in synchronism with a second control signal.

4. A semiconductor memory device comprising: a memory array of a plurality of memory cells arranged in rows and columns, means for selecting one of said rows, a random access circuit coupled to said columns of said memory array for performing a random selection of said columns in response to column address information for reading data therefrom and writing data thereto, a serial data input terminal to which write data are sequentially applied one by one, and a serial write circuit coupled to said serial data input terminal and said columns for operatively writing write data sequentially applied to said serial data input terminal to said columns simultaneously, said serial write circuit including a data storage section having a plurality of storage units, a write transfer gate section having a plurality of transfer gates each coupled between each one of said storage units and each one of said columns, a data input circuit coupled to said serial data input terminal for receiving write data, and a serial write selection circuit coupled between said data input circuit and said data storage section for sequentially applying the received write data to said storage units one by one in synchronism with a control signal, and control means for enabling all of said write transfer gates simultaneously thereby to apply the write data stored in said stoage units to said columns in parallel.

5. The memory device according to claim 4, further comprising a serial read circuit coupled to said columns for sequentially outputting data from said columns one by one, said serial read circuit including a data register section having a plurality of register units, a read transfer gate section having a plurality of transfer gates each coupled between each one of said columns and each one of said register units, an output circuit and a serial read selection circuit for serially selecting said transfer gates one by one thereby to transfer data held by said register units to said output circuit in synchronism with a control signal.

6. A semiconductor memory device comprising; a memory cell array including word lines arranged in rows, digit lines arranged in columns, and a plurality of memory cells arranged in rows and columns; a row selection circuit coupled to said word lines for operatively selecting one of said word lines to enable the memory cells coupled to the selected word line; a serial read circuit coupled to said digit lines for serially outputting at a first terminal data from said digit lines one by one, said serial read circuit including a plurality of first storage units, a plurality of read transfer gates each coupled between each one of said first storage units, first control means for operatively enabling said read transfer gates simultaneously, an output circuit, and a first serial selection circuit coupled between said first storage units and an input terminal of said output terminal for serially selecting said first storage units for connection to the input terminal of said output circuit one by one in response to a first control signal; and a serial write circuit coupled to said digit lines and receiving serially applied write data, said serial write circuit including an input circuit for receiving write data applied serially, a plurality of second storage units, a plurality of write transfer gates each coupled between each one of said second storage units and each one of said digit lines, second control means for operatively enabling said write transfer gates simultaneously, a second serial selection circuit coupled between an output terminal of said input circuit and said second storage units for serially selecting said second storage units one by one thereby to apply write data serially applied to said input circuit to said second storage units one by one.

7. The memory device according to claim 6, further comprising a random access circuit for operatively performing a random access with respect to said cell array in response to low address information and column address information.

8. The memory device according to claim 6, in which said second serial selection circuit includes a serial decoder which starts the serial selection of said second storage units from the location determined by column address information.

* * * * *

UNITED STATES PATENT AND TRADEMARK OFFICE
CERTIFICATE OF CORRECTION

PATENT NO. : 4,899,316

DATED : February 6, 1990

INVENTOR(S) : Akira NAGAMI

It is certified that error appears in the above-identified patent and that said Letters Patent is hereby corrected as shown below:

Col. 3, line 19, delete "diesnabled" and insert --disenabled--;

Col. 3, line 32, delete the 2nd occurrence of "22-i+1,";

Col. 4, line 43, delete "k";

Col. 5, line 30, delete "stoage" and insert --storage--;

Col. 6, line 36, delete "low" and insert --row--.

Signed and Sealed this

Twenty-sixth Day of February, 1991

Attest:

HARRY F. MANBECK, JR.

*Attesting Officer*

*Commissioner of Patents and Trademarks*